United States Patent
Wang et al.

(10) Patent No.: US 12,113,044 B2
(45) Date of Patent: Oct. 8, 2024

(54) SEMICONDUCTOR PACKAGE AND MANUFACTURING METHOD THEREOF

(71) Applicant: Advanced Semiconductor Engineering, Inc., Kaohsiung (TW)

(72) Inventors: Shan-Bo Wang, Kaohsiung (TW); Chin-Li Kao, Kaohsiung (TW); An-Hsuan Hsu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 71 days.

(21) Appl. No.: 17/676,094

(22) Filed: Feb. 18, 2022

(65) Prior Publication Data

US 2023/0268314 A1    Aug. 24, 2023

(51) Int. Cl.
*H01L 23/00* (2006.01)
*H01L 25/10* (2006.01)
*H01L 23/498* (2006.01)

(52) U.S. Cl.
CPC .............. *H01L 24/81* (2013.01); *H01L 24/05* (2013.01); *H01L 24/11* (2013.01); *H01L 24/13* (2013.01);
(Continued)

(58) Field of Classification Search
CPC ......... H01L 24/14; H01L 24/16; H01L 24/17; H01L 25/105; H01L 23/49816; H01L 23/49822; H01L 23/49833; H01L 2224/05147; H01L 2224/11849; H01L 2224/13105; H01L 2224/13147; H01L 2224/13582; H01L 2224/13605; H01L 2224/13611; H01L 2224/13647; H01L 2224/14505; H01L 2224/16157; H01L 2224/16167; H01L 2224/16506; H01L 2224/17505; H01L 2224/81097; H01L 2224/81211; H01L 2224/81815; H01L 2224/81825; H01L 2224/81935;
(Continued)

(56) References Cited

U.S. PATENT DOCUMENTS 6,635,960 B2 * 10/2003 Farrar .................... H01L 25/065
                                                             257/776
11,798,923 B2 * 10/2023 Zhang ................. H01L 23/5386
(Continued)

OTHER PUBLICATIONS

"What is a Pad in PCB Design and Development" by The Sierra Circuits Team, Mar. 16, 2021.*

*Primary Examiner* — Karen Kusumakar
*Assistant Examiner* — Shawn Shaw Muslim
(74) *Attorney, Agent, or Firm* — FOLEY & LARDNER LLP

(57) ABSTRACT

A semiconductor device package and a fabrication method thereof are disclosed. The semiconductor package comprises: a package component having a first mounting surface and a second mounting surface; and a first electronic component having a first conductive pad signal communicatively mounted on the first mounting surface through a first type connector; wherein the first type connector comprises a first solder composition having a lower melting point layer sandwiched between a pair of higher melting point layers, wherein the lower melting point layer is composed of alloys capable of forming a room temperature eutectic.

20 Claims, 8 Drawing Sheets

(52) U.S. Cl.
CPC .............. *H01L 24/14* (2013.01); *H01L 24/16* (2013.01); *H01L 24/17* (2013.01); *H01L 25/105* (2013.01); *H01L 23/49816* (2013.01); *H01L 23/49822* (2013.01); *H01L 23/49833* (2013.01); *H01L 2224/05147* (2013.01); *H01L 2224/11849* (2013.01); *H01L 2224/13105* (2013.01); *H01L 2224/13147* (2013.01); *H01L 2224/13582* (2013.01); *H01L 2224/13605* (2013.01); *H01L 2224/13611* (2013.01); *H01L 2224/13647* (2013.01); *H01L 2224/14505* (2013.01); *H01L 2224/16157* (2013.01); *H01L 2224/16167* (2013.01); *H01L 2224/16506* (2013.01); *H01L 2224/17505* (2013.01); *H01L 2224/81097* (2013.01); *H01L 2224/81211* (2013.01); *H01L 2224/81815* (2013.01); *H01L 2224/81825* (2013.01); *H01L 2224/81935* (2013.01); *H01L 2225/1023* (2013.01); *H01L 2225/1041* (2013.01); *H01L 2225/1058* (2013.01)

(58) Field of Classification Search
CPC ..... H01L 2225/1023; H01L 2225/1041; H01L 2225/1058; H01L 24/81; H01L 24/05; H01L 24/11; H01L 24/13; H01L 25/0652; H01L 2224/73204; H01L 2225/06572; H01L 24/32; H01L 25/50
See application file for complete search history.

(56) References Cited

U.S. PATENT DOCUMENTS

| | | | |
|---|---|---|---|
| 2018/0323358 A1* | 11/2018 | Tollefsen | H10N 10/817 |
| 2020/0006227 A1* | 1/2020 | Hu | H01L 21/76802 |
| 2022/0139864 A1* | 5/2022 | Nitta | C08G 59/62 |
| | | | 257/734 |

* cited by examiner

SEMICONDUCTOR PACKAGE AND MANUFACTURING METHOD THEREOF

BACKGROUND

1. Technical Field

The present disclosure relates generally to semiconductor device packages and manufacturing methods thereof, and pertains particularly to a low-temperature bumping mechanism for semiconductor device packages.

2. Description of the Related Art

Modern semiconductor packaging has evolved toward increasingly sophisticated integration architecture (e.g., system-in-package (SiP) architecture), which often contains a 2.5D or 3D functional electronic integration with multiple device components miniaturized through IC assembly technologies.

For a highly integrated package structure that incorporates multiple electrical components on several different mounting surfaces, the associated fabrication technique are becoming increasingly complicated. In recent years, two or more reflow operations commonly take place in a SiP process.

In such a scenario, if the melting point of a solder material deployed in a prior reflow process is close to the melting point of a solder material deployed in a later reflow process, the subsequent reflow process may likely cause damage to a previously formed solder connector. In some cases, previously disposed electronic component from a different mounting surface may suffer the risk of detachment or falling off due to re-melting of an already-deployed solder connector.

SUMMARY

Arrangements of the instant disclosure relates to an electrical device structure that includes an interconnector structure having a bonding layer that includes a bonding material. The bonding material has a first melting point lower than a second melting point of the bonding layer.

In some arrangements, the bonding layer includes an intermediate layer. The intermediate layer includes a eutectic layer or an alloy layer.

In some arrangements, the intermediate layer includes an intermedium material configured to facilitate forming of an intermetallic compound layer from the bonding material and a material of a pad of a substrate.

In some arrangements, the intermedium material facilitates diffusion of the bonding material to the pad.

In some arrangements, the intermetallic compound layer is nearer to the pad than the intermediate layer is to the pad.

In some arrangements, the intermedium material includes tin (Sn).

In some arrangements, the bonding layer includes an intermetallic compound layer.

In some arrangements, the bonding layer includes copper (Cu), and wherein the bonding material includes gallium (Ga).

In some arrangements, the structure further includes a first substrate including a first pad. The bonding layer is disposed on the first pad. The bonding layer includes a first layer stacked on the first pad and a second layer stacked on the first layer. A melting point of the first layer is higher than a melting point of the second layer.

In some arrangements, a melting point of the first pad is higher than the melting point of the bonding layer.

In some arrangements, the structure further includes a second substrate including a second pad connected to the bonding layer. The bonding layer further includes a third layer disposed between the second pad and the second layer. The third layer includes a substantially identical material composition as that of the first layer.

In some arrangements, a melting point of the third layer is higher than melting point of the second layer.

Arrangements of the instant disclosure relates to an electrical device structure that includes a substrate, a first electronic component electrically connected on a first region of the substrate through a first interconnector, and a second electronic component electrically connected on a second region of the substrate through a second interconnector. The first interconnector includes first melting point that is greater than a second melting point of a second bonding material of the second interconnector.

In some arrangements, the first region is located at a first side of the substrate. The second region is located at a second side of the substrate opposite to the first side.

In some arrangements, the structure further includes a third electronic component disposed on a third region at the first side of the substrate through a third interconnector. The third interconnector includes a third material having a third melting point that is lower than the first melting point of the first interconnector.

In some arrangements, the structure further includes a third electronic component disposed on a third region of the substrate through a third interconnector. The third interconnector includes a third material having a third melting point lower than the first melting point of the first interconnector, wherein the third region is located at a third side of the substrate.

In some arrangements, the first electronic component includes a pad. The bonding layer is disposed between the pad and the substrate. The bonding layer includes a first layer stacked on the pad and a second layer stacked on the first layer. A melting point of the first layer is higher than a melting point of the second layer.

In some arrangements, a melting point of the pad is higher than a melting point of the bonding layer.

In some arrangements, the substrate includes a second pad connected to the bonding layer. The bonding layer further includes a third layer disposed between the pad and the second layer. The third layer includes a substantially identical material composition as that of the first layer. A melting point of the third layer is higher than the melting point of the second layer.

Arrangements of the instant disclosure further provides a method of package fabrication that includes providing a first substrate, disposing a first reflow-able material on the first substrate, and reflowing to form an interconnection structure on the first substrate. A melting point of the interconnection structure is higher than a melting point of the first reflow-able material.

In some arrangements, the method further includes forming an intermedium layer between a contact of the first substrate and the first reflow-able material, the intermedium layer being configured to facilitate diffusing of an element of the reflow-able material toward the contact.

In some arrangements, the intermedium layer includes tin (Sn).

In some arrangements, the method further includes heating to facilitate diffusion of a metal element of the reflow-able material toward the first pad.

BRIEF DESCRIPTION OF THE DRAWINGS

So that the manner in which the above recited features of the present disclosure can be understood in detail, a more particular description of the disclosure, briefly summarized above, may be had by reference to arrangements, some of which are illustrated in the appended drawings. It is to be noted, however, that the appended drawings illustrate only typical arrangements of this disclosure and are therefore not to be considered limiting of its scope, for the disclosure may admit to other equally effective arrangements.

DETAILED DESCRIPTION

Figure 1:
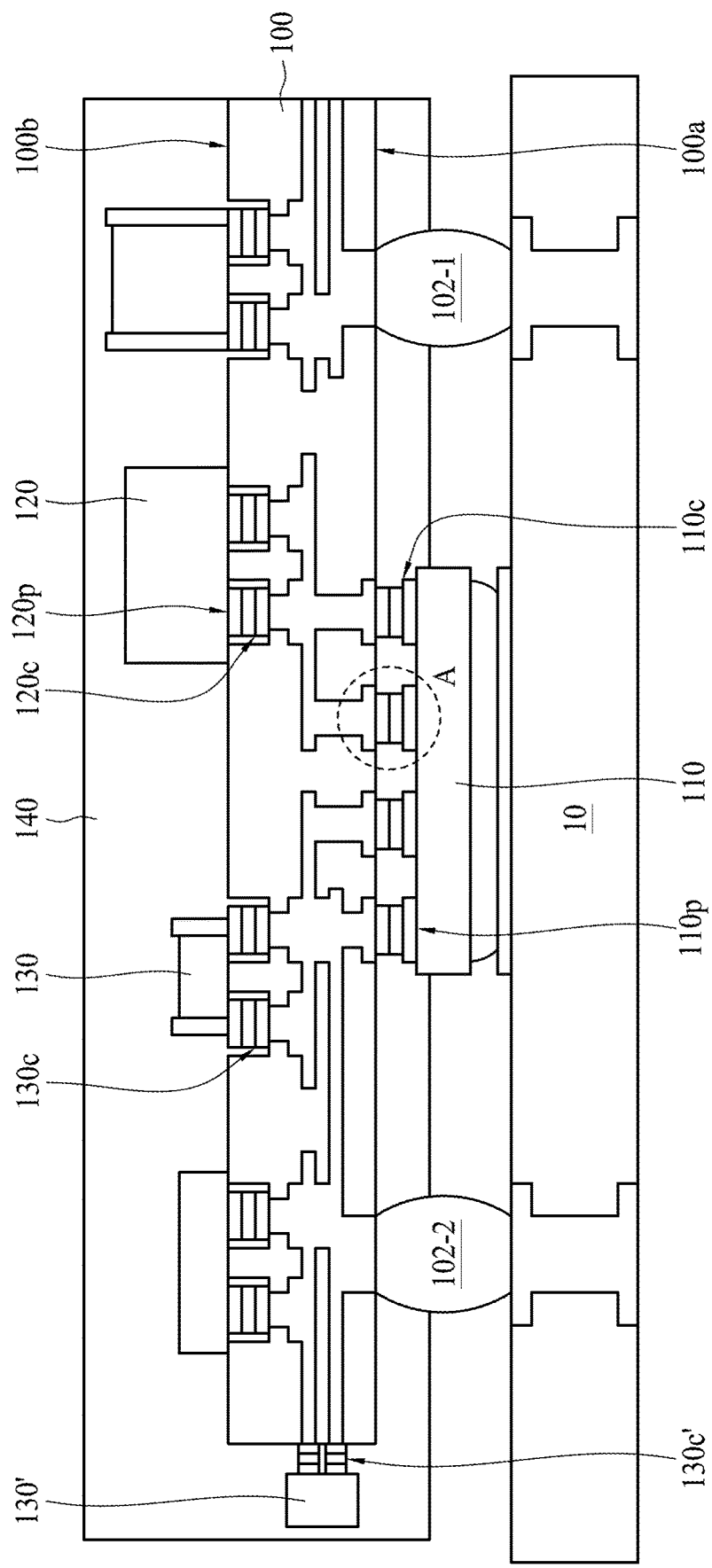
FIG. 1 shows a schematic illustration of a semiconductor package in accordance with some arrangements of the instant disclosure.

The present disclosure will now be described more fully hereinafter with reference to the accompanying drawings, in which example arrangements of the disclosure are shown. This disclosure may, however, be embodied in many different forms and should not be construed as limited to the example arrangements set forth herein. Rather, these example arrangements are provided so that this disclosure will be thorough and complete, and will fully convey the scope of the disclosure to those skilled in the art. Like reference numerals refer to like elements throughout.

The terminology used herein is for the purpose of describing particular example arrangements only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

As used herein, the term "substrate" generally refers to a base material or construction upon which additional materials are formed. In some examples, on a micro component level, a substrate may refer to a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductor material. On a macro package level, a substrate may refer to components that provide structural support and enable signal connection for other functional device components, such as a printed circuit board (PCB).

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are defined with reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to or traverses the major plane of the substrate. The major plane of the substrate is defined by a surface of the substrate having a relatively large area compared to other surfaces of the substrate. In some examples, the major plane is shown to be horizontal on the figures of the present disclosure.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if the arrangements of the components are inverted in the figures, elements described as "below" or "beneath" or "under" or "on bottom of" other elements or features would then be oriented "above" or "on top of" the other elements or features. Thus, the term "below" can encompass both an orientation of above and below, depending on the manner in which the element is depicted in the figures, which will be evident to one of ordinary skill in the art.

As used herein, the terms "connect," "connected," and "connection" refer to an operational coupling or linking. Connected components can be directly coupled to one another or can be indirectly coupled to one another, such as through another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein. For example, "substantially all" typically refers to at least 90%, at least 95%, at least 99%, and at least 99.9%.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter ("S·m^-1"). Typically, an electrically conductive material is one having a conductivity greater than about 104 S·m^-1, such as at least about 105 S·m^-1 or at least about 106 S·m^-1. Electrical conductivity of a material can sometimes vary with temperature. Unless otherwise specified, electrical conductivity of a material is defined at room temperature.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

The term "alloy" refers to a mixture containing two or more metals, and optionally additional non-metals, where the elements of the alloy are fused together or dissolved into each other when molten. The notation used herein for alloy compositions lists two or more elements using their International Union of Pure and Applied Chemistry (IUPAC) symbols separated by a forward slash ("/"). When given, the proportions of the elements in the alloy are indicated by subscripts corresponding to the weight percent of the element in the alloy. For example, Sn/Bi represents an alloy of tin (Sn) and bismuth (Bi), which can be any proportion of these two elements. Sn60/Bi40 represents a specific alloy of tin and bismuth that contains 60 percent by weight of tin and 40 percent by weight of bismuth.

The terms "melting temperature" or "melting point," as used herein, refer to the temperature (a point) at which a solid becomes a liquid at atmospheric pressure.

The term "eutectic" refers to a mixture or an alloy in which the constituent parts are present in such proportions that the constituents melt simultaneously, and the melting point is as low as possible. Accordingly, a eutectic alloy or mixture solidifies at a single temperature. In eutectic mixtures the solidus and liquidus temperatures are identical, i.e., the mixture melts completely at one temperature, the eutectic point. One of ordinary skill in the art will appreciate that for a specific combination of two metals, there is typically only one proportion that is eutectic.

The term "non-eutectic" refers to a mixture or an alloy that does not possess eutectic properties. Accordingly, when a non-eutectic alloy solidifies, its components solidify at different temperatures, and the overall composition exhibits a melting range.

"Solder" is a fusible metal alloy used to join together metal parts and having a melting point below that of the workpiece(s). Solder has a characteristic melting behavior that does not change substantially with repeated heat/cool cycles. Solder can include eutectic or non-eutectic alloys. During reflow, intermetallics may form within solder and between solder and elements in joined surfaces (e.g. copper pads), yet they often represent only a small proportion of the soldered joint (<5%). Therefore, typically, a prior applied solder may be re-melted under substantially the same conditions as the original application.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure.

FIG. 1 shows a schematic illustration of a semiconductor package in accordance with some arrangements of the instant disclosure. For instance, the semiconductor package may adopt a SiP architecture, which includes a package module that contains a functional electronic system or subsystem that is integrated and miniaturized through IC assembly technologies. In some arrangements, the semiconductor package includes heterogeneous integration of single or multiple chips (e.g., specialized processor, DRAM, flash memory), surface mount device (SMD) passive components (e.g., resistor/capacitor/inductor, filters, and connectors), micro electromechanical systems (MEMS) device, sensors, other active/passive components, and pre-assembled package or subsystem.

Referring to FIG. 1, the example semiconductor package includes one or more package components (e.g., component 100). In various arrangements, the package component 100 may include a substrate, e.g., a die, an interposer, a redistribution structure (e.g., RDL), and so on, which provides a pair of opposing substantially planar mounting planes (e.g., a first mounting surface 100*a* and a second mounting face 100*b*) for hosting a plurality of electronic components (e.g., chips 110, 120, 130, 130', etc.). The semiconductor package may be further mounted on a supporting structure 10, such as a PCB.

In the instant arrangement, the package component 100 defines a top mounting plane (e.g., a first mounting surface 100*b*, on which chips 120 and 130 are mounted) and a bottom mounting plane (e.g., a second mounting surface 100*a*, on which chip 110 is mounted). In other arrangements, depending on the functionality wished to be integrated, multiple tiers of mounting planes/surfaces may be arranged in the package structure for hosting more device components. In some arrangements, the first mounting surface (e.g., surface 100*a*) and the second mounting surface (e.g., surface 100*b*) are non-coplanar. In some arrangements, the first mounting surface and the second mounting surface are arranged at different planar elevations. In some arrangements, the first mounting surface and the second mounting surface are opposite to each other. In the illustrated arrangement, the plurality of electronic components 110, 120 are mounted over the opposing mounting surfaces 100*a*, 100*b*, respectively. In some arrangements, a mounting point may be defined on a lateral (side) surface of a substrate for hosting or supporting additional electronic components (e.g., component 130').

The example package further includes an encapsulating member 140 that provides dual-side coverage over the packaging component 100, and encapsulates the electronic components 110, 120, 130 on both the front side and the back side of the package structure. The dual-side arrangement of the encapsulating member 140 not only protects the package components from potentially hazardous environmental elements but also offers better overall thermal expansion matching, which helps to reduce undesirable warpage of the package structure during fabrication process.

Furthermore, electrical connectors (e.g., connectors 102-1, 102-2) are provided on the bottom surface of the packaging component 100. The connectors 102-1, 102-2 are accessibly exposed from the encapsulating member 140, serving as electrical connecting interfaces between the semiconductor package and the supporting structure 10.

Each of the electronic components (e.g., chips 110/120) is provided with a plurality of conductive pads (e.g., pads 110*p*/120*p*) configured to communicate signal connection/interconnection with other package components. For instance, as shown in FIG. 1, the first electronic component 110 mounted on the bottom surface 100a includes a plurality of upward-facing pads (e.g., the first pad 110p). In some arrangements, the conductive pad 110p may include a copper pad accessibly arranged over a surface of a chip. Each conductive pad 110p may be electrically and structurally connected to a corresponding package component (e.g., a pad from the packaging component 100). The connection between the conductive pads may be established through a first type connector (e.g., a stack of bonding layer(s) 110c, encircled by the dotted line, marked as region A). The first type connector 110c may include electrically conductive bonding materials that enables both structural and signal connection between package components. The conductive pads and the bonding layers collectively form an interconnector structure.

In various arrangements, the first type connector 110c may include a solder connector made of a particular material formulation (e.g., an alloy composition that includes a selective metal combination with particular mixing ratio). Likewise, the top-mounted second electronic component 120 is provided with a plurality of downward-facing conductive pads (e.g., the second pad 120p), each of which is electrically connected to a pad of the packaging component 100 through a second type connector (e.g., a stack of bonding layer(s) 120c) including a solder material of a particular formulation. Likewise, as shown in FIG. 1, the side-mounted component 130' is connected to the substrate 100 through a plurality of third type connectors 130c'. In various arrangements, the electronic component 130 is electrically connected to a fourth type connector (e.g., a stack of bonding layer(s) 130c) including a solder material of a particular formulation.

For a highly integrated package structure that incorporates multiple electrical components on several different mounting surfaces, the fabrication process becomes increasingly complicated. For one thing, it is often not feasible to integrate the plurality of electronic components (e.g., chips 110/120), especially those designated for different mounting surfaces within a package structure, through a single reflow process.

In some arrangements, various electronic components designated for different mounting planes/surfaces are to be mounted in a particular sequential order. In recent years, two or more reflow operations commonly taken place in a SiP process. In such a scenario, if the melting point of a solder material deployed in a prior reflow process is lower than the melting point of a solder material deployed in a later reflow process, the subsequent reflow process would likely cause damage to a previously formed solder connector. In some cases, previously disposed electronic component from a different mounting surface may even suffer the risk of falling off or detaching due to re-melting of an already-deployed solder joint.

To combat such issues, solder connectors of different material formulation may be used during the SiP process. For instance, in some arrangements, solder materials of higher melting points are selected for initial reflow processes, while solder formulation of lower melting points are reserved for later reflow procedures. In some arrangements, solder compositions of lower melting points may be selected due to thermal budget concerns in various backend processes. For example, in some arrangements, a solder composition having a higher melting point (e.g., Sn—Ag alloy, which may be formed to have a melting point of about 210° C.) is initially used, while a solder composition of lower melting point (e.g., Sn—Bi alloy, which may have a melting point of about 140° C.) is used in a subsequent reflow process. However, factors such as process requirements (e.g., lead-free), material compatibility, and the concern over material costs inevitably limit the applicable material selectivity in solder composition. In some cases, the choice of suitable material selection would run out after four or five rounds of reflow operations.

Figure 2:
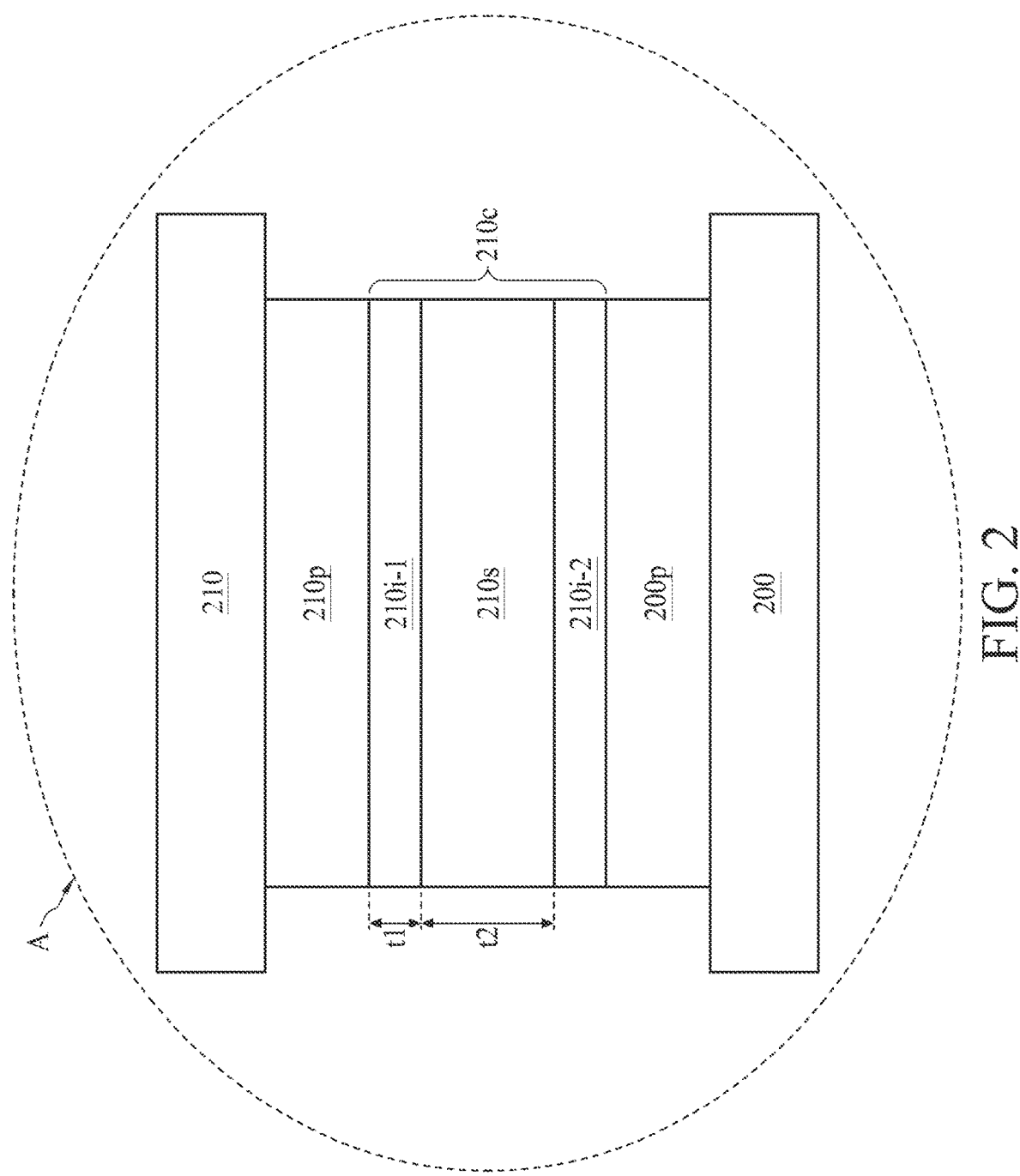
FIG. 2 shows a schematic local enlargement view of a semiconductor package in accordance with some arrangements of the instant disclosure.

FIG. 2 shows a schematic local enlargement view of a semiconductor package in accordance with some arrangements of the instant disclosure. For instance, the regional enlargement view of FIG. 2 may correspond to an electrical connector encircled by the dashed line in region A of FIG. 1 (e.g., the first type connector 110c).

In accordance with various arrangements of the instant disclosure, at least one of the first type connector (e.g., connector 110c shown in FIG. 1) or the second type connector (e.g., connector 120c) includes a self-restructuring solder composition designed to operate at a low reflow temperature yet capable of self-restructuring into a connector structure having elevated melting point. The self-restructure soldering mechanism in accordance with the instant disclosure can reduce the likelihood of thermal damage to the prior-deployed solder connectors from additional subsequent reflow processes.

Particularly, the example solder connector shown in FIG. 2 is provided with a stacked structure 210c that includes a sandwiching composition distribution of a plurality of sublayers. For instance, the stacked structure 210c of the example connector includes a plurality of distinguishable sub-layers (e.g., layers 210i-1, 210s, and 210i-2). The stacked structure 210c is arranged between a pair of corresponding pads 200p, 210p from the respective mounting surfaces of two different package components 200, 210.

In some arrangements, the conductive pads 200p, 210p are metal pads disposed over the respective silicon substrates of the package components 200, 210. The conductive pads 200p, 210p may include copper or aluminum material. In some arrangements, the sub-layers of the stacked structure 210c includes a lower melting point layer 210s "sandwiched" between a pair of higher melting point layers 210i-1, 210i-2.

For soldering material selection in packaging applications, alloys of bismuth (Bi) and tin (Sn) have been widely applied. For one thing, bismuth-tin alloys are readily available at reasonable cost in particulate form. For another, the tin in the bismuth-tin alloys, and the intermetallics formed when tin reacts with copper, are all decent electrical and thermal conductors. Moreover, the residual, elemental bismuth and the copper-tin intermetallics formed during thermal processes typically present melting temperatures outside the range of subsequent thermal processing and testing typically performed. Tin and bismuth are not considered toxic and are compatible with commonly used metal circuit components.

However, both bismuth and copper-tin intermetallics tend to be brittle and therefore susceptible to damage when exposed to mechanical stress. Further, elemental bismuth is not a good electrical conductor and rather lacks thermal conductivity. Therefore, although alloys of bismuth and tin used in conjunction with copper offer several favorable characteristics, an alternative replacement for bismuth may provide a further cure for the primary deficiencies of low electrical and thermal conductivity, and brittleness. Accordingly, it would be desirable to limit/replace the use of bismuth in the solder compositions in electronic applications.

On the other hand, the use of alloys substantially different from the eutectic composition may have unfavorable consequences in solder joining. For one thing, the wider melting range of non-eutectic alloys may require prolonged retention time between parts to be joined, thus resulting in longer cycle times. Also, the longer dwelling time may result in the formation of thicker intermetallic compound layers, which are more prone to cracking along the laminar interface with the conductive pads. Further, the wetting ability of the non-eutectic solder is often inferior to that of the eutectic solder. As a result, the non-eutectic solder joints are often dull in appearance, which renders automated visual inspection more difficult than for shiny eutectic joints. For these reasons, alloys having a composition substantially within eutectic proportions are viewed as favorable for solder joining.

In various arrangements of the instant disclosure, the lower melting point layer 210s is an intermediate layer including a composition that includes a first element having a eutectic point with one of the elements in the higher melting point layer 210i-1/210i-2. In some arrangements, the intermediate layer (e.g., the lower melting point layer 210s) is a solder alloy layer.

The higher melting point layer 210i-1/210i-2, on the other hand, may be an intermetallic compound layer including a composition that includes a same element as that in the conductive pad 200p/210p. A material characteristic characteristics of the stacked structure 210c is configured in such a way that, a melting point of the intermetallic composition in layer 210i-1/210-2 is higher than a melting point of the composition in the sandwiched layer 210s. In some arrangements, the lower melting point layer 210s is composed of an alloy capable of forming a room temperature eutectic.

A variety of process-compatible material combinations may be applicable. For instance, in some arrangements, the intermetallic composition in the high melting point layer 210i-1/210i-2 includes at least one of gallium (Ga), indium (In), tellurium (Te), mercury (Hg), thallium (Tl), antimony (Sb), selenium (Se), or polonium (Po). In some arrangements, the intermetallic composition of the high melting point layer 210i-1/210i-2 further includes at least one of copper, silver, gold, palladium, nickel, or aluminum. In some arrangements, the material composition of the intermediate layer 200s sandwiched between the intermetallic composition layers 210i-1, 210i-2 includes at least one of tin, bismuth, lead, or silver.

In the instant arrangement, both the lower melting point layer 210s and the higher melting point layer 210i-1/210i-2 include a common element having an elemental melting point close to room temperature (e.g., 20~30° C.). In some arrangements, the common element shared by both of the higher and the lower melting point layers 210s, 210i is gallium (Ga). In some arrangements, the higher melting point layer 210i-1/210i-2 is composed of an alloy including the common element and a material of the conductive pad 200p/210p. In some arrangements, the material of the conductive pad 200p/210p includes copper (Cu).

In some arrangements, the package component 200/210 is composed of a first dielectric material having a glass transition temperature, and the elemental melting point of the common element in the higher and the lower melting point layers 210i/210s is lower than the glass transition temperature of the first dielectric material. In some arrangements, the first dielectric material includes epoxy. In some arrangements, the room temperature eutectic includes a eutectic temperature higher than the elemental melting point of the common element under atmospheric pressure.

In some arrangements, the higher melting point layer 210i-1/210i-2 includes intermetallic material of $CuGa_2$. In some arrangements, the lower melting point layer 210s includes a solder composition composed of tin (Sn) with minor amount of gallium, e.g., $Sn_3Ga$. In some arrangements, the lower melting point layer 210s further includes silver (Ag), bismuth (Bi), or lead (Pb).

It is found that the intermetallic material of $CuGa_2$ possesses favorable characteristics such as good electrical and thermal conductivity, as well as decent mechanical properties as such the enhanced tolerance against stress and cracking. In some arrangements, a thickness ratio between one of the higher melting point layer 210i-1/210i-2 and the lower melting point layer 210s is in a range of from about 1:20 to about 20:1. In the arrangements with higher $GuGa_2$ intermetallic thickness-ratio, the electrical and thermal conductivity of the solder connector (e.g., the second type connector 120c) may be improved. On the other hand, in the arrangements where lower $CuGa_2$ thickness-ratio is employed, the solder connector would provide higher adhesiveness and exhibit properties closer to conventional solder materials. In some arrangements, the ratio of thickness between one of the higher melting point layer 210i-1/210i-2 (i.e., t1) and the lower melting point layer 210s (i.e., t2) is about 1:2.

In some arrangements, as shown in the example of FIG. 2, the thickness profile of the pair of intermetallic composition layers 210i-1, 210i-2 are substantially symmetric (e.g., the upper and lower intermetallic composition layers exhibit substantially comparable global thickness distribution). It is noted that in practice, the thickness profile of the intermetallic composition layer 210i-1/210i-2 may not be continuously uniform as schematically illustrated in the instant figure but rather exhibits a degree of non-uniform variation across a width of the stacked structure 210c of the solder connector along a horizontal direction.

Figure 3:
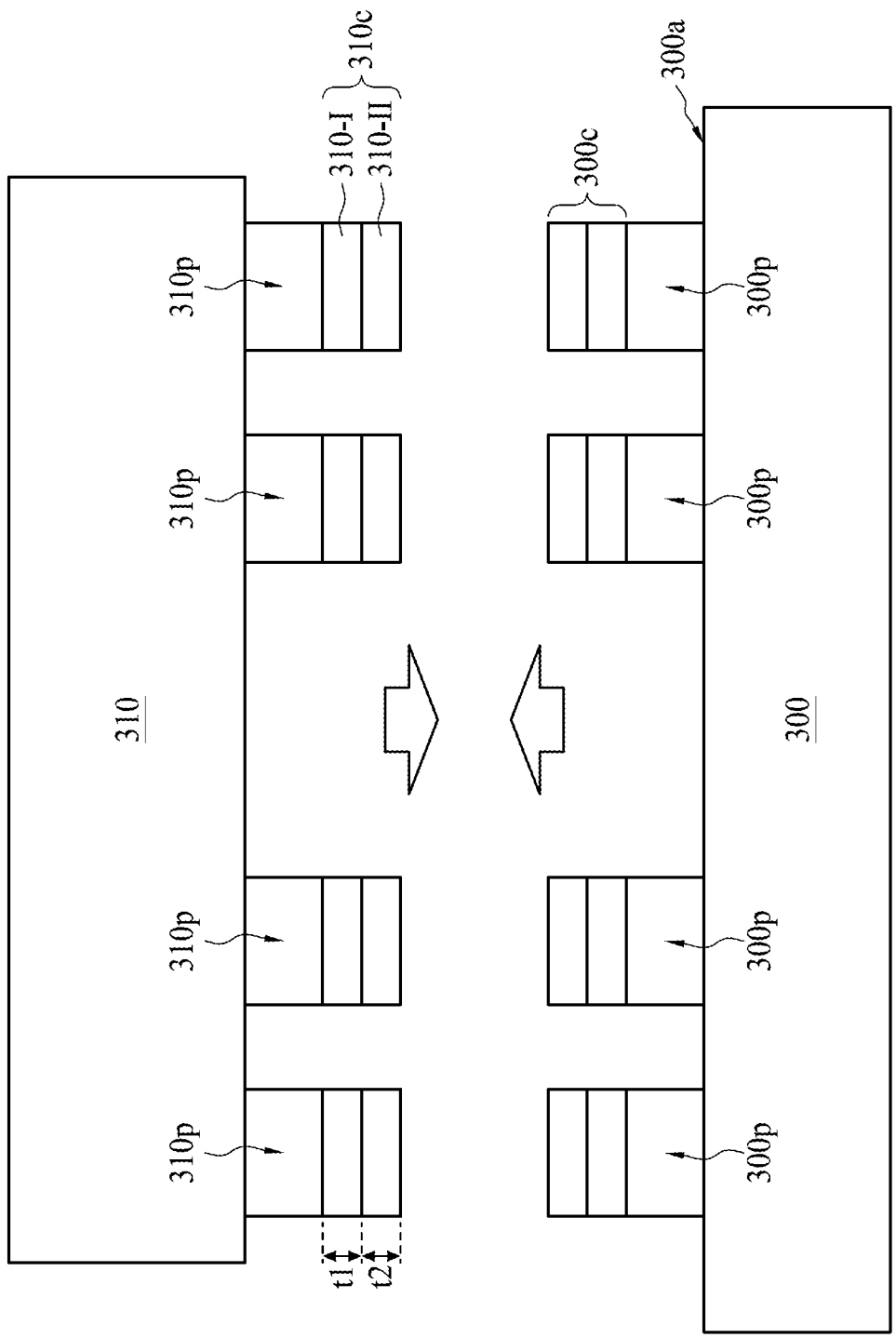
FIG. 3 schematically shows a component bonding arrangement for a semiconductor package in accordance with some arrangements of the instant disclosure.

FIG. 3 schematically shows a component bonding arrangement for a semiconductor package in accordance with some arrangements of the instant disclosure. For instance, FIG. 3 may depict a component bonding arrangement between an electronic component (e.g., the first chip 110) and a package component (e.g., package component 110-1/110-2).

As shown in FIG. 3, the example electronic component (e.g., chip 310) is provided with a plurality of bond pads 310p on a downward facing surface thereof. Bond pads 310p are configured to be coupled to the mounting surface 300a of an example package component 300, which is provided with a plurality of corresponding bond pads 300p. A plurality of connector stacks 300c, 310c are respectively distrusted over the bond pads 300p, 310p for communicating signal communicative coupling between the chip 310 and the package component 300.

The connector stacks 300c, 310c on the respective bond pads 300p, 310p may include intermedium material configured to establish structural and electrical coupling upon reflow. In the illustrated arrangement, the connector stack 310c includes a transition (or intermedium) layer 310-I and a conversion layer 310-II. In accordance with various arrangements of the instant disclosure, the conversion layer 310-II is arranged further from the conductive pad 310p than the transition layer 310-I.

In addition, in the instant arrangement, the lower connector stack 300c on the corresponding bond pad 300p is provided with a substantially mirroring arrangement with respect to the upper connector stack 310c. In some arrangements, the lower and the upper connector stacks 300c, 310c are substantially symmetrical in structural configuration.

In an example fabrication process, a semiconductor package component (e.g., chip 310 or component 300) having a plurality of bond pads (e.g., pads 310p, 300p) is received. In typical arrangements, the bond pads on the package components are made of metal material. In some arrangements, the material of the conductive pad 310p includes at least one of copper (Cu), silver (Ag), gold (Au), nickel (Ni), or aluminum (Al). In some arrangements, a composite interconnector stack (e.g., stack structure 310c/300c) may be formed on the exposed surface of the respective bond pads by suitable methods such as sputtering or plating.

In some arrangements, a low melting point layer (e.g., the conversion layer 310-II) is disposed over the bond pad 310p. The low melting point layer (e.g., layer 310-II) would include a material having a melting point lower than that of the bond pad material. In some arrangements, the material for the low melting point layer 310-II may include one or more of gallium (Ga), indium (In), tellurium (Te), mercury (Hg), thallium (Tl), antimony (Sb), selenium (Se), or polonium (Po). In some arrangements, the low melting point layer 310-II may substantially include a material having a melting point close to typical room temperature (e.g., of a fabrication facility). In some embodiments, a room temperature may be in a range of about 20-35° C. In some arrangements, the low temperature layer 310-II is chosen from a material capable of forming intermetallic composition that exhibits favorable characteristics (e.g., good electrical/thermal conductivity and mechanical strength) with the bond pad material.

In some arrangements, the composite interconnector stack 310c is further provided with a high melting point layer (e.g., the transition layer 310-1) inserted between the low melting point layer 310-II and the bond pad 310p. The high melting point layer 310-I includes a material having a melting point higher than that of the lower melting point layer 310-II. In some arrangements, the high melting point layer 320-I includes one or more solder material such as tin (Sn), bismuth (Bi), lead (Pb), or silver (Ag).

In accordance with various arrangements of the instant disclosure, the low melting point layer 310-II is chosen from a material that has an eutectic point with the material in the low melting point layer 310-I. In some arrangements, the low melting point (conversion) layer 310-I includes an element capable of forming a room temperature eutectic alloy with the element in the high melting point (transition) layer 310-II. In some arrangements, the eutectic point of the material in the low melting point layer 310-II and that in the high melting point layer 310-I is not higher than 30° C. under atmospheric pressure.

In some arrangements, a low melting point metal is used in conjunction with a low temperature eutectic counterpart such as tin, so as to substantially reduce the melting point of both the high melting point layer 310-I and the low melting point layer 310-II, thus enabling the adoption of a lower reflow temperature. Meanwhile, a liquefied high melting point (e.g., tin) layer 310-I would serve as a transition layer that allows induction of atomic diffusion from the low melting point layer 310-II (through the high melting point layer 310-1) toward the conductive pad 310p.

Atomic migration from the low melting point layer 310-II may trigger the conversion of the low melting point layer 310-II (which was originally further away from the pad 310p) into a binary intermetallic layer on the conductive pad 310p (e.g., layer 210i-1/210i-2 as shown in FIG. 2). With proper process control and a relatively low reflow temperature (e.g., 150° C.), the material from the low melting point layer 310-II may trade place with the originally closer high melting point layer 310-1 and be substantially converted into an intermetallic layer on the conductive pad 310p.

The melting point of the converted intermetallic composition is selected to be higher than the melting point of a solder composition used in a subsequently-deployed connector formed on a different mounting surface. In some arrangements, the low melting point layer 310-II made of plated gallium is used as in conjunction with a conductive pad (e.g., pad 310p) made of copper, so as to trigger formation of a binary eutectic composition $CuGa_2$ (which, upon formation, possesses an elevated melting temperature of about 259° C.). On the other hand, the solder material from the high melting point layer 310-I would migrate to the central region of the self-restructuring type connector of the instant disclosure and settle as an intermediate layer (e.g., layer 210s as shown in FIG. 2) sandwiched between a pair of intermetallic layers. In some arrangements, the central region of the self-restructuring connector would be replaced substantially by tin, the melting point (e.g., about 230° C.) of which is noticeably higher than a required reflow temperature (e.g., 150° C.).

There are various benefits of such a material arrangement. On the one hand, the lower reflow temperature required to induce atomic diffusion and form the binary eutectic composition allows the connector of the instant disclosure to be formed at a relatively low temperature, thus reduces the risk of damaging other solder connectors that are already in place. In addition, the elevated melting point of the intermetallic composition once formed further relieves the risk of potential damage to itself when subject to multiple subsequent reflow processes.

In some arrangements, the ratio between a thickness t1 of the high melting point (transition or intermedium) layer 310-I to a thickness t2 of the low melting point (conversion) layer 310-II is in a range of about 1:20 to about 20:1. It is observed that, a thicker low melting point layer 310-II (e.g., higher gallium content ratio) may facilitate more pronounced atomic diffusion toward the conductive (copper) pad 310p yet require longer reaction time for intermetallic conversion, thus may call for a longer annealing duration. Higher gallium content also means higher ratio of intermetallic material (e.g., thicker $CuGa_2$ layer) would be generated on the conductive pad 310p. A thicker intermetallic layer such as $CuGa_2$ may yield better electrical conduction and thermal dissipation properties. Conversely, a thicker high melting point layer 310-I (e.g., higher solder/tin content ratio) may translate to lower material cost, and the resultant connector may exhibit properties that resemble conventional solder materials. Nevertheless, an overly high solder content ratio (e.g., a substantially thicker tin layer) may prolong the migration distance for the gallium atoms, thus resulting in longer reaction time. In some arrangements, the ratio of thickness between the high melting point (transition) layer 310-I (i.e., t1) and the lower melting point (conversion) layer 310-II (i.e., t2) is about 1:1 to about 2:1.

The self-restructuring connector in accordance with the instant disclosure may be employed complementary to conventional type of solder connectors to provide a more cost-conscious package solution. By way of example, in some arrangements, the cheaper conventional type connectors (e.g., the second type connector 120c as shown in FIG. 1) may be applied to certain mounting surfaces in a semiconductor package, while the self-restructuring type connector (e.g., the first type connector 110c) of the instant disclosure being deployed selectively to other mounting surfaces. For instance, the self-restructuring type connector of the instant disclosure may be employed on temperature-sensitive components in a semiconductor package.

For example, with reference made back to FIG. 1, in some arrangements, a second electronic component (e.g., chip 120) having a plurality of second conductive pads (e.g., pad 120$p$) may be mounted to the second mounting surface (e.g., surface 100$a$) through a second type connector (e.g., connector 120$c$), that includes a different solder composition that is incapable of forming a room temperature eutectic. In some arrangements, the solder composition of the second type connector includes one or more Sn—Ag, Sn—Bi, or Sn—Pb solder material. In some arrangements, the conventional/second type connector is applied prior to the deployment of the self-restructuring type connector in accordance with the instant disclosure. Nevertheless, for complex package architectures that possess multiple tiers of mounting surfaces, the self-restructuring type connector of the instant disclosure may be conveniently deployed in repetition, as the low reflow temperature required thus would post little harmful risk to the high overall melting point thereof upon reflow.

Figure 4:
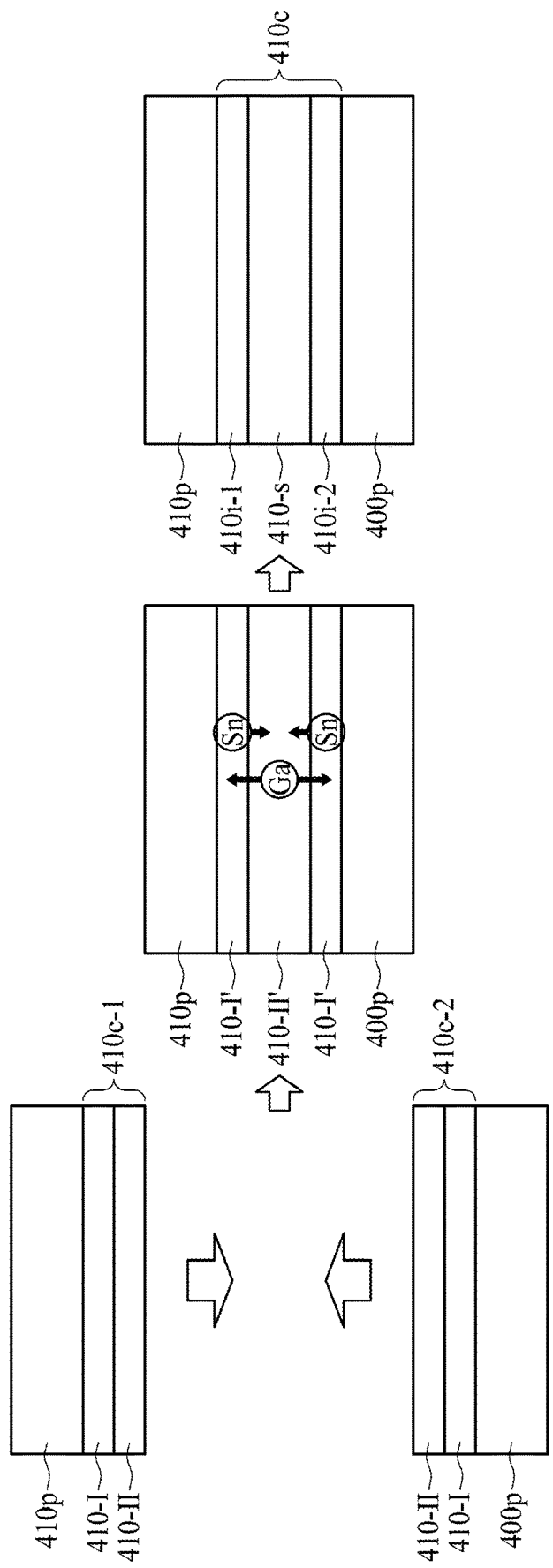
FIG. 4 schematically shows a component bonding mechanism for a semiconductor package in accordance with some arrangements of the instant disclosure.

FIG. 4 schematically shows a component bonding mechanism for a semiconductor package in accordance with some arrangements of the instant disclosure. For instance, FIG. 4 illustrates a self-restructuring bonding mechanism that employs a substantially symmetrical arrangement.

As illustrated in the top left section of FIG. 4, a transition layer 410-I is disposed on the exposed surface of a copper (Cu) pad 410$p$. In the illustrated arrangement, the transition layer 410-I includes tin (Sn) material. In addition, a conversion layer 410-II is disposed over the transition layer 410-I. In the illustrated arrangement, the conversion layer 410-II includes gallium (Ga) material. The transition layer 410-I and the conversion layer 410-II collectively forms a preliminary connector stack 410$c$-1. On the bottom left section of FIG. 4, another preliminary connector stack 410$c$-2 having comparable (e.g., substantially mirroring) structural profile is provided on a corresponding copper pad 400$p$.

In some arrangements, the transition layer 410-I includes a plated layer made of tin (Sn) or tin-silver alloy (Sn—Ag). In some arrangements, a thickness of the transition layer 410-I is configured in a range of about 1-50 um. In some arrangements, the conversion layer 410-II includes a plated layer of gallium (Ga). In some arrangements, a thickness of the conversion layer 410-II is configured in a range of about 1-50 um.

In the middle section of FIG. 4, the upper and the lower preliminary stacks 410$c$-1, 410$c$-2 are brought into contact. A low temperature reflow operation is performed to facilitate coupling between the upper and lower connector joints. It has been observed that, in some arrangements, structural coupling may be achieved between a layer thickness of 5 um (for both the transition layer 410-I and the conversion layer 410-II) under a reflow temperature of about 150° C.) for a period of about 1 hour.

In the right section of FIG. 4, a self-restructured connector stack 410$c$ is formed between the corresponding pair of copper pads 400$p$, 410$p$ upon reflow. As depicted previously, the low temperature reflow operation triggers atomic diffusion of the gallium atoms from the conversion layer 410-II' toward the respective copper pads 400$p$/410$p$, which are subsequently converted into intermetallic sub-layers 410$i$-1, 410$i$-2. Meanwhile, the solder material from the transition layer 410-I' aggregates toward the central region of the connector stack 410$c$ and forms an intermediate sub-layer 410$s$. Moreover, the thickness profile of the pair of intermetallic composition layers 410$i$-1, 410$i$-2 are substantially symmetric (e.g., the upper and lower intermetallic composition layers exhibit substantially comparable global thickness distribution). Nevertheless, it should be noted that, the thickness profile of the intermetallic composition layer 410$i$-1/410$i$-2 may not be continuously uniform as schematically illustrated in the instant figure but rather exhibits a degree of non-uniform variation across a width of the stacked structure 410$c$ of the self-restructured connector along a horizontal direction.

Figure 5A:
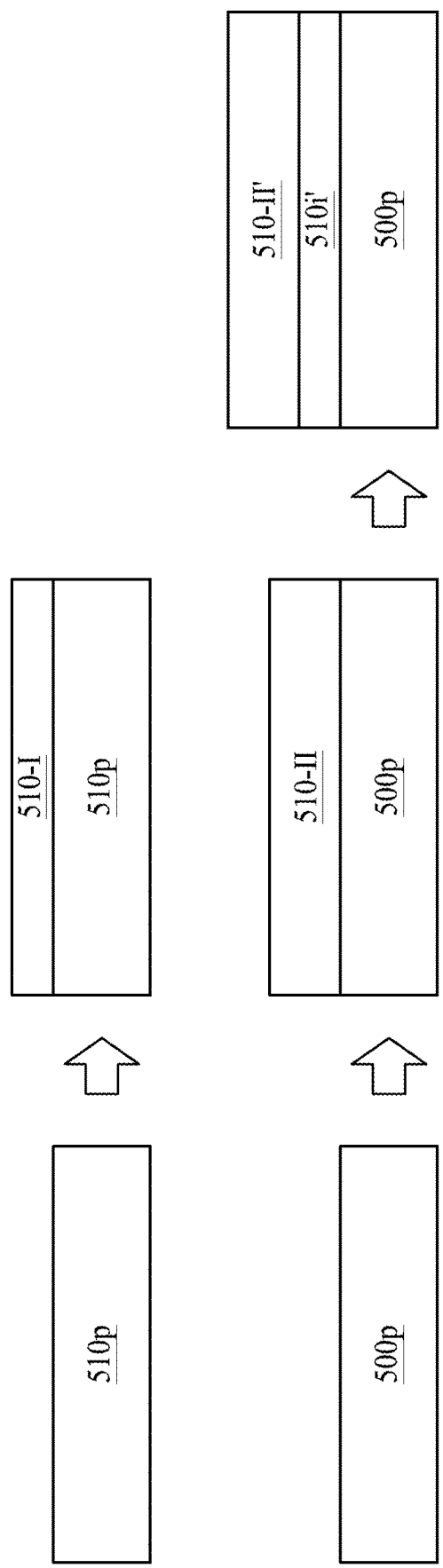
FIGS. 5A-5B schematically show another component bonding mechanism for a semiconductor package in accordance with some arrangements of the instant disclosure.
Figure 5B:
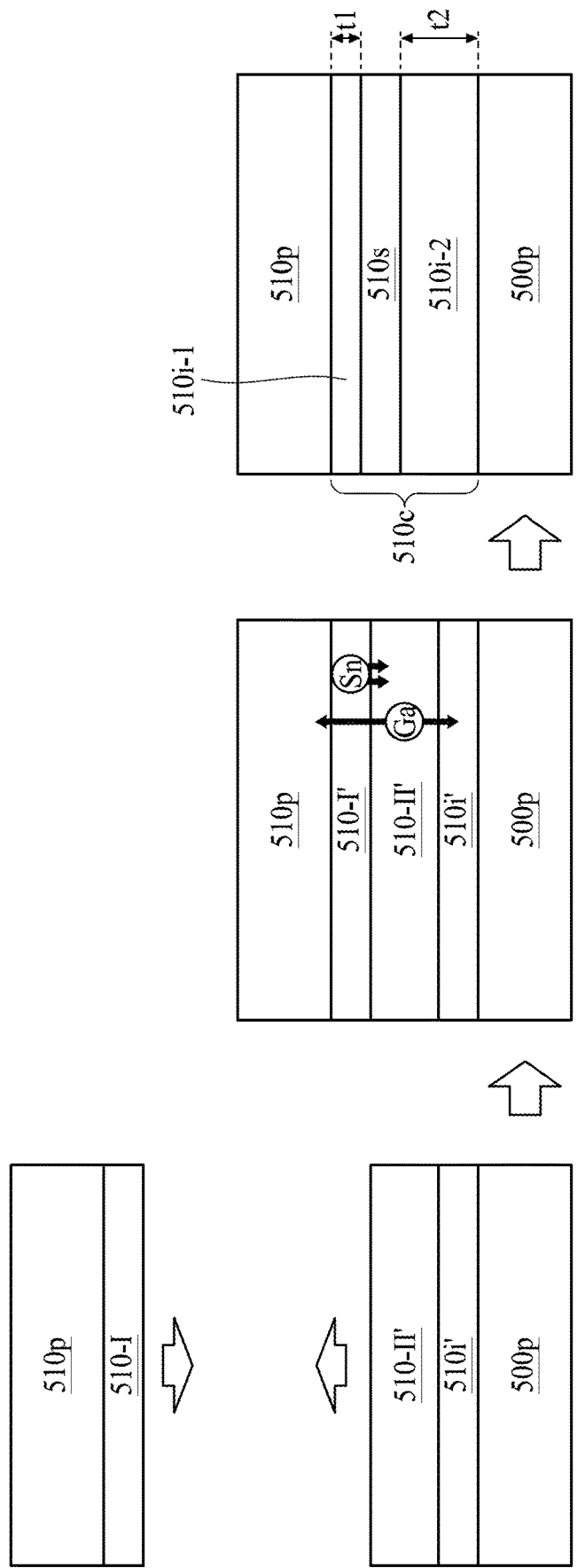

FIGS. 5A-5B schematically show a component bonding mechanism for a semiconductor package in accordance with some arrangements of the instant disclosure. For instance, FIG. 5A-5B illustrates a self-restructuring bonding mechanism that utilizes an asymmetrical configuration.

As illustrated in FIG. 5A, a transition layer 510-I is disposed on the exposed surface of an upper pad 510$p$. In the illustrated arrangement, the transition layer 510-I includes tin material. In an asymmetric arrangement, a conversion layer 510-II is disposed on the exposed surface of an opposing lower pad 500$p$. In the illustrated arrangement, the conversion layer 510-II includes a gallium (Ga) composition. A preliminary intermetallic layer 510$i$' of a thinner thickness is formed at the contact interface between the lower pad 500$p$ and the conversion layer 510-II'.

In some arrangements, the transition layer 510-I includes a plated layer made of tin (Sn) or tin-silver alloy (Sn—Ag). In some arrangements, a thickness of the transition layer 510-I is configured in a range of about 1-50 um. In some arrangements, the conversion layer 510-II includes a plated layer of gallium (Ga). In some arrangements, a thickness of the conversion layer 510-II is configured in a range of about 1-50 um.

Referring to FIG. 5B, the respectively disposed transition layer 510-I and the conversion layer 510 on the upper and the lower pads 510$p$, 500$p$ are brought into contact. A low temperature reflow operation is performed to facilitate coupling between the upper and lower connector joints. Similar to that depicted above, a self-restructured connector stack 510$c$ is formed between the corresponding pair of opposing pads 500$p$, 510$p$ upon reflow. The low temperature reflow operation triggers atomic diffusion of the gallium atoms from the conversion layer 510-II toward the respective copper pads 500$p$, 510$p$, which are further converted into intermetallic sub-layers 510$i$-1, 510$i$-2. Meanwhile, the solder material from the transition layer 510-I' would aggregate toward the central region of the connector stack 510$c$ and forms an intermediate sub-layer 510$s$. Due to the initial formation of the preliminary intermetallic layer 510$i$', the thickness profile of the resultant lower intermetallic sub-layer 510$i$-2 would be substantially thicker than that of the upper intermetallic sub-layer 510$i$-1. In various arrangements, a ratio of thickness (i.e., t1:t2) between the intermetallic layers 510$i$-1, 510$i$-2 in a range of about 1:1 to about 1:5.

Figure 6A:
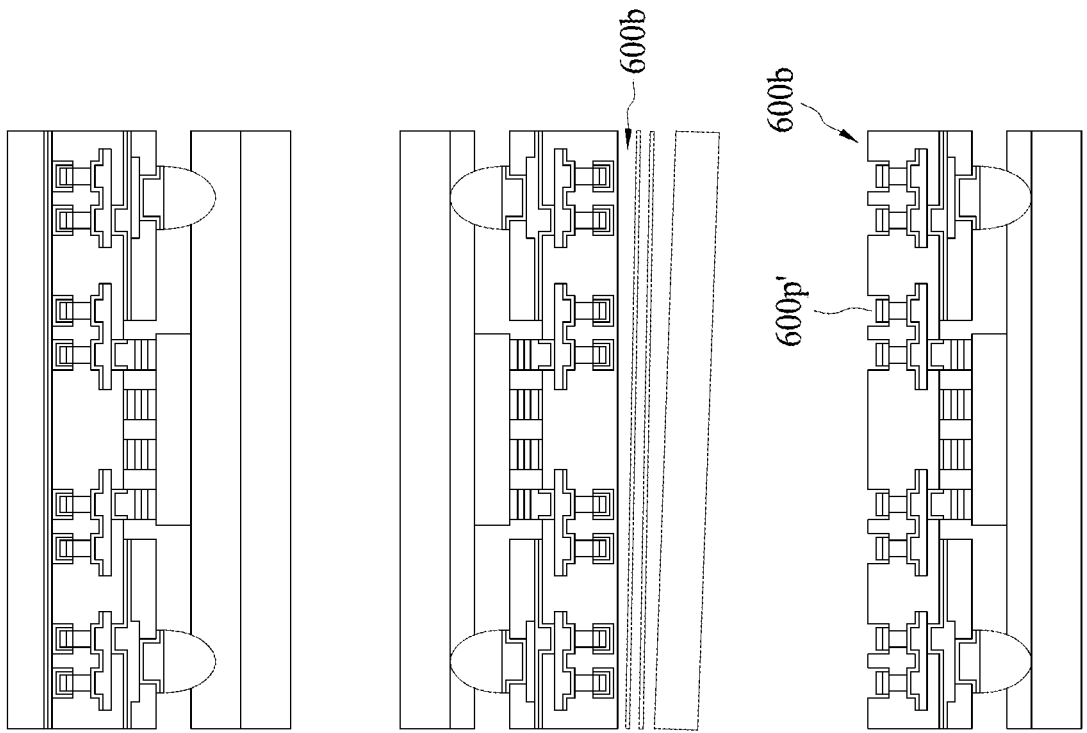
FIGS. 6A-6B show schematic illustrations of an example semiconductor package structure in various stages of fabrication in accordance with some arrangements of the instant disclosure.
Figure 6A:
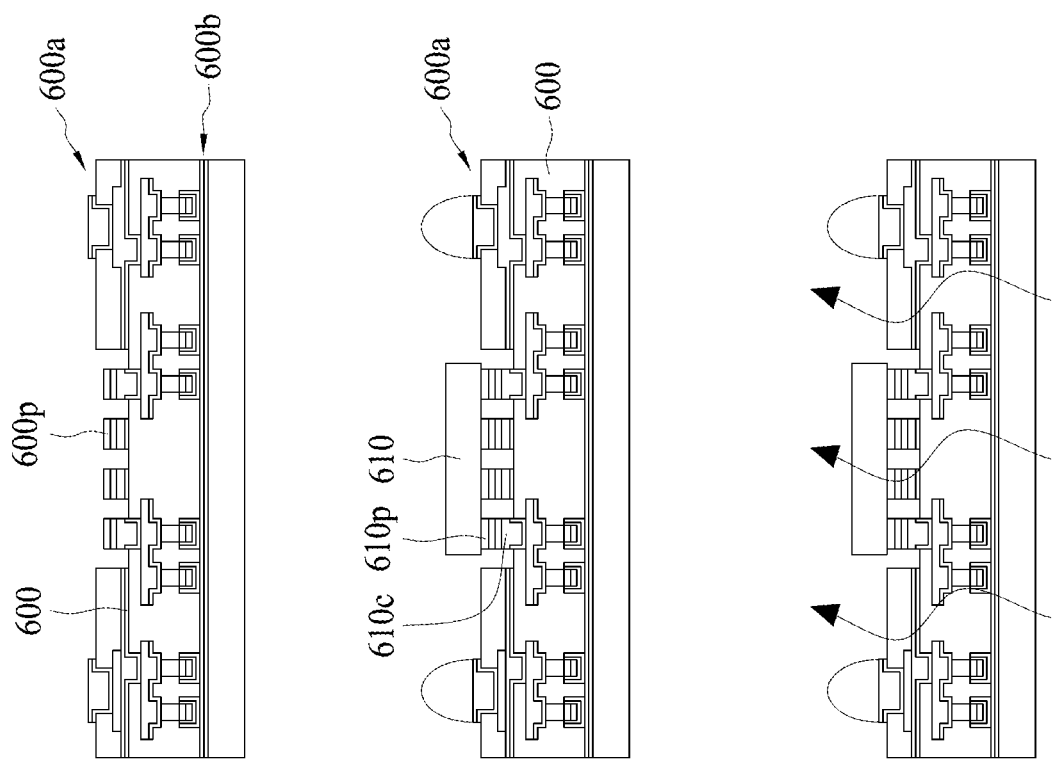
Figure 6B:
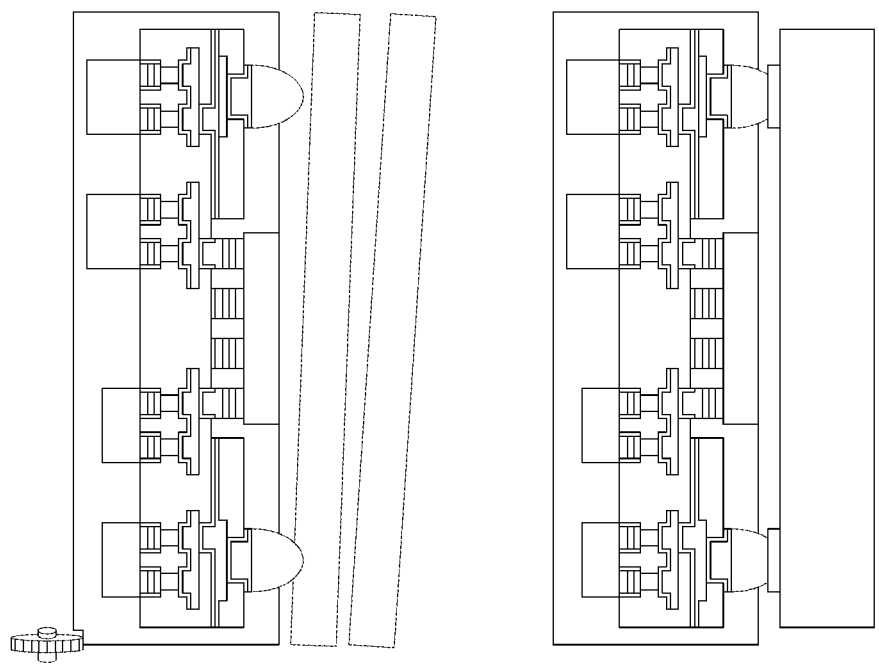
Figure 6B:
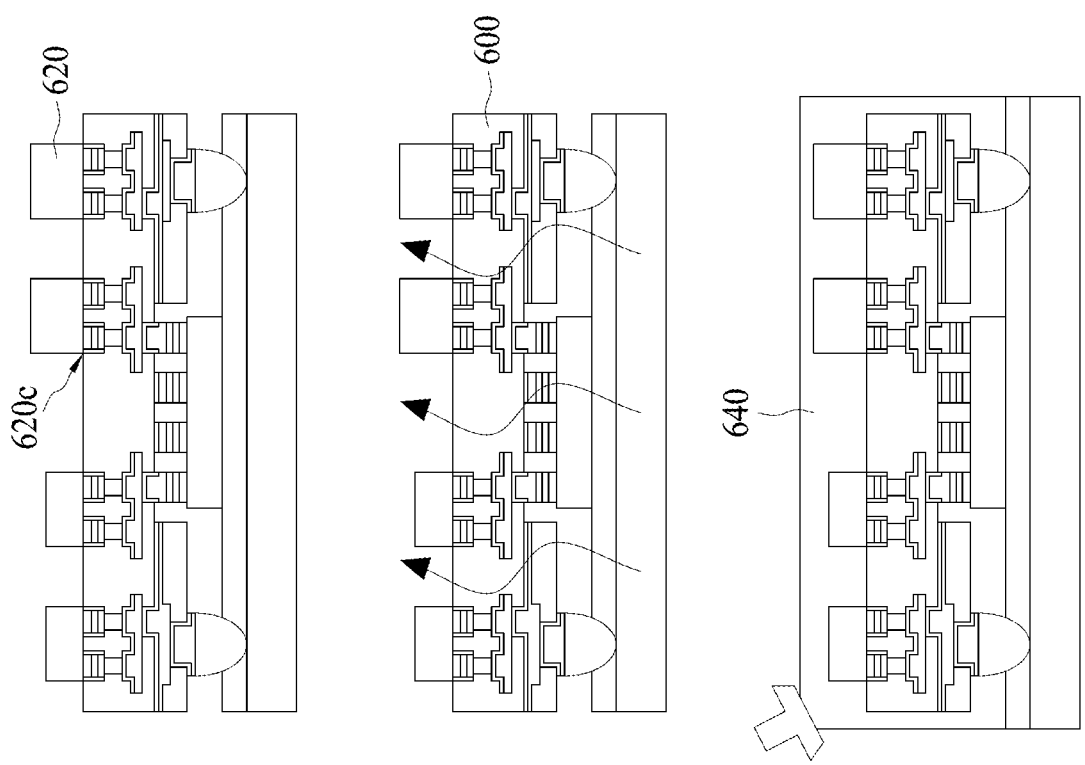

FIGS. 6A-6B show schematic illustrations of a semiconductor package during various stages of fabrication in accordance with some arrangements of the instant disclosure. It is noted that, for illustrational simplicity and clarity, some details or sub-components in the schematic fabrication process are not explicitly or repeatedly labeled.

From the top left corner of FIG. 6A, a package component 600 is received. In the illustrated arrangement, the component 600 defines a first mounting plane 600$a$ and a second mounting plane 600$b$. A plurality of conductive pads (e.g., pad 600$p$) are accessibly arranged on the mounting surfaces 600$a$, 600$b$.

A first electronic component 610 is disposed over the first mounting plane 600a of the package component 600. For instance, the first electronic component (e.g., die 610) is provided with a plurality of conductive pads (e.g., pad 610p) exposed from a surface thereof. A connector stack 610c is provided between the respective pads 600p and 610p of components 600, 610. In some arrangements, the connector stack 610c includes a cost-effective conventional solder stack. In some arrangements, the connector stack 610c includes a self-restructuring connector stack as depicted above. In some arrangements, the connector stack 610c between the respective pads 600p, 610p is provided with a transition layer and a conversion layer as discussed in previous arrangements. In some arrangements, the conversion layer is initially arranged further away from the conductive pads 600p, 610p (e.g., at a central region of the connector stack).

As the electronic component 610 is brought in contact with the package component 600, a first reflow operation is performed. In some arrangements in which the economical conventional solder joints (e.g., Sn—Bi composition) are employed, the first reflow operation may be performed at a temperature setting of about 170° C. On the other hand, in some arrangements where the self-restructuring mechanism is employed, a relatively low reflow temperature (e.g., not exceeding 150° C.) may be sufficient to facilitate atomic diffusion and intermetallic conversion as depicted above, thus forming a first type connector having a lower melting point layer sandwiched between a pair of higher melting point layers (such as that shown in FIG. 2). In some arrangements, the lower melting point layer is composed of alloys capable of forming a room temperature eutectic, where a eutectic temperature under atmospheric pressure of the room temperature eutectic is lower than the first reflow temperature.

Turning to the upper right corner of FIG. 6A, the intermediate package structure is re-oriented up-side-down (inverted) and retained over a second carrier (e.g., by a die attachment tape) upon completion of the first reflow operation. The first carrier is then stripped from the second mounting surface 600b, thus exposing a plurality of conductive pads (e.g., pad 600p').

Referring to the upper left corner of FIG. 6B, one or more second electronic component (e.g., die 620) is mounted on the second mounting plane 600b of the package component 600. A second reflow operation is then performed to melt and join the connector stack placed between the respective pads of the die 620 and the component 600. In accordance with various arrangements of the instant disclosure, the self-restructuring connector mechanism is employed for the second reflow operation. Accordingly, in the arrangements where cheaper conventional solder connectors were employed in the first reflow operation, the second reflow operation may be conducted at a lower temperature, thus minimizing the risk of thermal damage to the already-deployed solder joints.

An encapsulation operation is then performed after the second reflow operation. In the illustrated arrangement, encapsulation compound 640 is provided over both the front side and back side of the package component, so as to provide better warpage resistance to the final package structure.

Turning to the upper right corner of FIG. 6B, the encapsulated package structure is then singulated and de-bonded from the second carrier, and subsequently mounted onto a supporting structure, such as a PCB.

Accordingly, in some arrangements, a semiconductor package includes a package component having a first mounting surface and a second mounting surface and a first electronic component having a first conductive pad signal communicatively mounted on the first mounting surface through a first type connector. The first type connector includes a first solder composition having a lower melting point layer sandwiched between a pair of higher melting point layers. The lower melting point layer is composed of alloys capable of forming a room temperature eutectic.

In some arrangements, the lower melting point layer and the higher melting point layer are respectively composed of a common element having an elemental melting point lower than 30 degrees Celsius.

In some arrangements, the higher melting point layer is composed of an alloy including the common element and a material of the first conductive pad.

In some arrangements, the higher melting point layer includes $CuGa_2$ intermetallic material.

In some arrangements, the lower melting point layer is composed of an alloy including tin (Sn) and gallium (Ga).

In some arrangements, the lower melting point layer further includes silver (Ag), bismuth (Bi), or lead (Pb).

In some arrangements, the package component is composed of a first dielectric having a glass transition temperature, and the elemental melting point of the common element is lower than the glass transition temperature.

In some arrangements, the room temperature eutectic includes a eutectic temperature lower than the elemental melting point of the common element under atmospheric pressure.

In some arrangements, the package further includes a second electronic component having a second conductive pad signal communicatively mounted on the second mounting surface through a second type connector. The second type connector has a second solder composition different from the first solder composition of the first type connector.

In some arrangements, the second solder composition of the second type connector includes an alloy incapable of forming a room temperature eutectic.

In some arrangements, a thickness ratio between one of the higher melting point layer and the lower melting point layer is in a range of from about 1:20 to about 20:1.

In some arrangements, a thicknesses profile of the pair of higher melting point layers are substantially asymmetric.

In some arrangements, the package further includes a second electronic component mounted on the second mounting surface of the package component through a second type connector. The second type connector is substantially identical to the first type connector.

Accordingly, in some arrangements, a semiconductor package component includes an electronic component having a connector stack disposed on a conductive pad accessibly arranged on a surface of the electronic component. The connector stack includes a transition layer and a conversion layer, and wherein the conversion layer is arranged further from the conductive pad than the transition layer.

In some arrangements, the conversion layer and the transition layer are capable of forming a room temperature eutectic alloy.

In some arrangements, the material of the conductive pad includes at least one of copper, silver, gold, palladium, nickel, or aluminum.

In some arrangements, the transition layer includes at least one of SnAg, SnBi, or SnPb.

In some arrangements, a eutectic temperature of the room temperature eutectic is lower than an elemental melting point of the conversion layer under atmospheric pressure.

In some arrangements, a thickness ratio between the transition layer and the conversion layer is in a range of about 1:20 to about 20:1.

Accordingly, in some arrangements, a method of fabricating a semiconductor package includes receiving a first electronic component having a connector stack disposed on a conductive pad accessibly arranged on a surface of the first electronic component, the connector stack being provided with a transition layer and a conversion layer, and the conversion layer is arranged further from the conductive pad than the transition layer. The first electronic component is mounted over a first mounting surface of a package component by performing a reflow process of a first temperature to form a first type connector having a lower melting point layer sandwiched between a pair of higher melting point layers.

In some arrangements, the lower melting point layer is composed of alloys capable of forming a room temperature eutectic. A eutectic temperature under atmospheric pressure of the room temperature eutectic is lower than the first temperature.

In some arrangements, the first temperature is not higher than 150° C.

In some arrangements, the first temperature is lower than a glass transition temperature of a first dielectric of the first electronic component.

In some arrangements, the method further includes mounting a second electronic component over a second mounting surface of the package component by performing a reflow process of the first temperature to form a second type connector.

In some arrangements, the first temperature is lower than a melting point of the lower melting point layer or a melting point of the higher melting point layer.

In some arrangements, the higher melting point layer includes an intermetallic material made from elements of the conductive pad and the conversion layer.

Those skilled in the art will readily observe that numerous modifications and alterations of the device and method may be made while retaining the teachings of the instant disclosure. Accordingly, the above disclosure should be construed as limited only by the metes and bounds of the appended claims.

What is claimed is:

1. An electrical device structure, comprising:
   a first package component; and
   an electrically conductive interconnector structure electrically connected to the first package component, comprising:
      a first conductive pad on the first package component, a first alloy layer, and a solder layer, wherein the first alloy layer comprises a first conductive elemental material with a melting point less than a melting point of the solder layer, and the first alloy layer is closer to the first conductive pad than the solder layer is.

2. The electrical device structure of claim 1, wherein a melting point of the first alloy layer is greater than the melting point of the solder layer.

3. The electrical device structure of claim 2, wherein the first alloy layer comprises a second conductive elemental material, and the first conductive pad comprises the second conductive elemental material.

4. The electrical device structure of claim 3, wherein the melting point of the first conductive elemental material is from about 20° C. to about 35° C.

5. The electrical device structure of claim 4, wherein the solder layer is in contact with the first alloy layer, and the solder layer does not comprise the first conductive elemental material.

6. The electrical device structure of claim 5, wherein the first conductive elemental material is gallium.

7. The electrical device structure of claim 1, further comprising:
   a second package component,
   wherein the electrically conductive interconnector structure comprises a second alloy layer and a second conductive pad on the second package component, the second alloy layer is closer to the second conductive pad than the solder layer is, and the second alloy layer comprises a second conductive elemental material with a melting point less than the melting point of the solder layer.

8. The electrical device structure of claim 7, wherein the solder layer is disposed between and in contact with the first alloy layer and the second alloy layer, and the melting point of the solder layer is less than a melting point of the first alloy layer and less than a melting point of the second alloy layer.

9. The electrical device structure of claim 8, wherein the first conductive pad comprises a third elemental material, the first alloy layer comprises the third elemental material, the second alloy layer comprises a fourth elemental material, and the second conductive pad comprises the fourth elemental material.

10. The electrical device structure of claim 9, wherein a thickness of the first alloy layer is less than a thickness of the solder layer.

11. The electrical device structure of claim 10, wherein the first alloy layer and the second alloy layer are disposed on opposite sides of the solder layer, and the thickness of the first alloy layer is different from a thickness of the second alloy layer.

12. The electrical device structure of claim 11, wherein the first alloy layer comprises metal elements the same as those of the second alloy layer.

13. The electrical device structure of claim 9, wherein the melting point of the first conductive elemental material and the melting point of the second conductive elemental material are from about 20° C. to about 35° C.

14. The electrical device structure of claim 13, wherein the solder layer does not comprise the first conductive elemental material and the second conductive elemental material.

15. The electrical device structure of claim 14, wherein the first package component is spaced apart from the second package component, and the first package component is electrically connected to the second package component through the electrically conductive interconnector structure.

16. An electrical device structure, comprising:
   a substrate;
   a first electronic component electrically connected on a first region of the substrate through a first interconnector; and
   a second electronic component electrically connected on a second region of the substrate through a second interconnector;
   wherein a first melting point of the first interconnector is greater than a second melting point of a bonding material of the second interconnector, and the first interconnector comprises a first conductive elemental material with a melting point from about 20° C. to about 35° C.

17. The electrical device structure of claim 16, wherein the second interconnector does not comprise the first conductive elemental material.

18. The electrical device structure of claim 17, wherein both the first interconnector and the second interconnector comprise a solder material.

19. The electrical device structure of claim 16, wherein the first interconnector is electrically conductive and comprises a first conductive pad abutting the first electronic component, a first alloy layer, and a solder layer, wherein the first alloy layer comprises the first conductive elemental material with the melting point less than a melting point of the solder layer, the first alloy layer is closer to the first conductive pad than the solder layer is, the solder layer comprises the first conductive elemental material and a second conductive elemental material, and an amount of the second conductive elemental material is greater than that of the first conductive elemental material within the solder layer.

20. The electrical device structure of claim 19, wherein the first conductive elemental material has an eutectic point with the second conductive elemental material.

* * * * *